United States Patent
Yusa et al.

(10) Patent No.: US 11,839,023 B2
(45) Date of Patent: *Dec. 5, 2023

(54) THREE-DIMENSIONAL MOLDED CIRCUIT COMPONENT

(71) Applicant: MAXELL, LTD., Kyoto (JP)

(72) Inventors: Atsushi Yusa, Nagaokakyo (JP); Satoshi Yamamoto, Suita (JP); Akiko Kito, Takatsuki (JP); Hironori Ota, Ibaraki (JP); Hideto Goto, Muko (JP); Naoki Usuki, Osaka (JP)

(73) Assignee: MAXELL, LTD., Otokuni-Gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/570,009

(22) Filed: Jan. 6, 2022

(65) Prior Publication Data
US 2022/0132660 A1    Apr. 28, 2022

Related U.S. Application Data

(60) Division of application No. 16/170,829, filed on Oct. 25, 2018, now Pat. No. 11,259,410, which is a (Continued)

(30) Foreign Application Priority Data
Apr. 27, 2016   (JP) ................. 2016-089522

(51) Int. Cl.
*H05K 1/02* (2006.01)
*H05K 1/11* (2006.01)
(Continued)

(52) U.S. Cl.
CPC .......... *H05K 1/0284* (2013.01); *B29C 45/14* (2013.01); *B29C 45/26* (2013.01); *H01L 33/64* (2013.01);
(Continued)

(58) Field of Classification Search
CPC .......... H05K 1/0284; H05K 1/02; H05K 1/05; H05K 1/0203; H05K 3/0014; H05K 3/185;
(Continued)

(56) References Cited

U.S. PATENT DOCUMENTS

| 4,751,136 A | 6/1988 | Kamiya et al. |
| 5,050,040 A | 9/1991 | Gondusky et al. |

(Continued)

FOREIGN PATENT DOCUMENTS

| EP | 0257657 A2 | 3/1988 |
| JP | S63-058986 A | 3/1988 |

(Continued)

OTHER PUBLICATIONS

Aug. 8, 2017 International Search Report issued in International Patent Application No. PCT/JP2017/016594.
(Continued)

*Primary Examiner* — Ishwarbhai B Patel
(74) *Attorney, Agent, or Firm* — Oliff PLC

(57) ABSTRACT

A three-dimensional molded circuit component, includes: a base member which includes a metal part and a resin part; a circuit pattern which is formed on the resin part; and a mounted component which is mounted on the base member, and is electrically connected to the circuit pattern. The resin part includes a resin thin film as a portion thereof, which includes a thermoplastic resin, of which a thickness is in the range of 0.01 mm to 0.5 mm, and which is formed on the metal part. The mounted component is arranged on the metal part via the resin thin film.

9 Claims, 5 Drawing Sheets

Related U.S. Application Data continuation of application No. PCT/JP2017/016594, filed on Apr. 26, 2017.

(51) Int. Cl.

| | | |
|---|---|---|
| *H05K 1/18* | (2006.01) | |
| *H01L 33/64* | (2010.01) | |
| *B29C 45/14* | (2006.01) | |
| *B29C 45/26* | (2006.01) | |
| *H05K 1/05* | (2006.01) | |
| *H05K 3/00* | (2006.01) | |
| *H05K 3/18* | (2006.01) | |
| *B29L 31/34* | (2006.01) | |
| *B29L 31/00* | (2006.01) | |

(52) U.S. Cl.
CPC .............. *H05K 1/02* (2013.01); *H05K 1/0203* (2013.01); *H05K 1/05* (2013.01); *H05K 1/11* (2013.01); *H05K 1/183* (2013.01); *H05K 3/0014* (2013.01); *H05K 3/185* (2013.01); *B29L 2031/3425* (2013.01); *B29L 2031/747* (2013.01); *H05K 2201/0129* (2013.01); *H05K 2201/10106* (2013.01)

(58) Field of Classification Search
CPC . H05K 2201/0129; H05K 2201/10106; H05K 2201/0191; H05K 1/056; H05K 1/0204; H01L 33/64; H01L 33/644; H01L 33/641; H01L 33/642; H01L 25/0753; H01L 33/62; B29C 45/14; B29C 45/26; B29C 45/14639; B29C 45/14377; B29C 45/14311; B29C 2045/14868; B29C 45/16; B29L 2031/3425; B29L 2031/747
See application file for complete search history.

(56) References Cited

U.S. PATENT DOCUMENTS

| | | | |
|---|---|---|---|
| 5,431,959 A * | 7/1995 | Kologe ................... | H05K 3/24 427/443.1 |
| 5,738,977 A * | 4/1998 | Van Der Sluis-Van Der Voort .... | H05K 3/244 430/318 |
| 5,777,380 A | 7/1998 | Otsuki et al. | |
| 6,232,558 B1 | 5/2001 | Tsukada et al. | |
| 6,499,217 B1 | 12/2002 | Yamada et al. | |
| 6,943,930 B2 | 9/2005 | Mi et al. | |
| 7,071,424 B1 | 7/2006 | Shirai et al. | |
| 7,199,400 B2 | 4/2007 | Sasuga | |
| 8,130,507 B2 * | 3/2012 | Origuchi ................ | H05K 1/185 257/676 |
| 8,569,080 B2 | 10/2013 | Chen et al. | |
| 9,716,061 B2 | 7/2017 | Palaniswamy et al. | |
| 11,259,410 B2 * | 2/2022 | Yusa ................ | B29C 45/14377 |
| 2003/0189830 A1 | 10/2003 | Sugimoto et al. | |
| 2004/0189170 A1 | 9/2004 | Aisenbrey | |
| 2005/0073846 A1 | 4/2005 | Takine | |
| 2006/0043382 A1 | 3/2006 | Matsui et al. | |
| 2006/0127684 A1 | 6/2006 | Naritomi et al. | |
| 2006/0208271 A1 | 9/2006 | Kim et al. | |
| 2008/0038476 A1 | 2/2008 | Cordani | |
| 2008/0171181 A1 * | 7/2008 | Zaderej .................. | H05K 3/185 428/209 |
| 2008/0217739 A1 * | 9/2008 | Lien ....................... | H05K 1/162 257/E27.048 |
| 2009/0095974 A1 | 4/2009 | Taguchi et al. | |
| 2009/0218665 A1 | 9/2009 | Yang | |
| 2011/0284914 A1 | 11/2011 | Suzuki et al. | |
| 2012/0103663 A1 | 5/2012 | Kobayashi et al. | |
| 2012/0138997 A1 | 6/2012 | Tasaki et al. | |
| 2012/0250326 A1 | 10/2012 | Sekine | |
| 2012/0326200 A1 | 12/2012 | Shen et al. | |
| 2013/0074332 A1 * | 3/2013 | Suzuki ................... | H05K 1/185 29/834 |
| 2013/0213697 A1 | 8/2013 | Palaniswamy et al. | |
| 2013/0285273 A1 | 10/2013 | Yusa et al. | |
| 2013/0320390 A1 | 12/2013 | Palaniswamy et al. | |
| 2014/0190727 A1 | 7/2014 | Lee et al. | |
| 2015/0041024 A1 | 2/2015 | Schulz et al. | |
| 2015/0357277 A1 * | 12/2015 | Nagai .................. | H05K 3/4007 174/255 |
| 2015/0366054 A1 | 12/2015 | Okasaka et al. | |
| 2016/0242292 A1 | 8/2016 | Nishimura et al. | |

FOREIGN PATENT DOCUMENTS

| | | |
|---|---|---|
| JP | H03-035584 A | 2/1991 |
| JP | H06-014579 B2 | 2/1994 |
| JP | H06-334338 A | 12/1994 |
| JP | H07-086445 A | 3/1995 |
| JP | H10-308562 A | 11/1998 |
| JP | 2002-185099 A | 6/2002 |
| JP | 2003-234557 A | 8/2003 |
| JP | 3443872 B2 | 9/2003 |
| JP | 2006-517738 A | 7/2006 |
| JP | 2007-67042 A | 3/2007 |
| JP | 2007-281189 A | 10/2007 |
| JP | 2008211150 A | 9/2008 |
| JP | 2009-6721 A | 1/2009 |
| JP | 2013-084822 A | 5/2013 |
| JP | 5681076 B2 | 3/2015 |
| WO | 00/59274 A1 | 10/2000 |
| WO | 2012/061182 A1 | 5/2012 |
| WO | 2013/027615 A1 | 2/2013 |

OTHER PUBLICATIONS

Aug. 8, 2018 Written Opinion issued in International Patent Application No. PCT/JP2017/016594.
Aug. 27, 2019 Office Action issued in Japanese Patent Application No. 2016-089522.
Oct. 18, 2019 Extended European Search Report issued in European Application No. 17789618.0.
Mar. 3, 2020 Office Action issued in Japanese Patent Application No. 2016-089522.
Jul. 30, 2020 Communication issued in European Application No. 17789618.0.
Oct. 13, 2020 Decision of Dismissal of Amendment in Japanese Patent Application No. 2016-089522.
Oct. 13, 2020 Decision of Refusal in Japanese Patent Application No. 2016-089522.
Jul. 16, 2021 Communication Issued in European Application No. 17789618.
Aug. 10, 2021 Notice of Reasons for Refusal Issued in Japanese Patent Application No. 2020-080976.
Feb. 25, 2022 Decision of Refusal issued in Japanese Patent Application No. 2020-080976.
Mar. 31, 2023 Office Action issued in European Patent Application No. 17789618.0.
Apr. 18, 2023 Office Action issued in Japanese Patent Application No. 2022-090639.

* cited by examiner

THREE-DIMENSIONAL MOLDED CIRCUIT COMPONENT

CROSS REFERENCE TO RERATED APPLICATION

This application is a Divisional Application of Application No. 16/170,829, filed Oct. 25, 2018, which issued as U.S. Pat. No. 11,259,410 on Feb. 22, 2022, which in turn is a Continuation Application of International Application No. PCT/JP2017/016594 which was filed on Apr. 26, 2017 and claiming priority to Japanese patent Application No. 2016-089522 filed on Apr. 27, 2016, the entire disclosures of which are incorporated herein by reference.

BACKGROUND OF THE INVENTION

Field of the Invention

The present invention relates to a three-dimensional molded circuit component in which a circuit pattern is formed on a base member (substrate, base material), which includes a metal part (metal portion) and a resin part (resin portion).

Description of the Related Art

In recent years, MIDs (Molded Interconnected Devices) have been put to practical use in smart phones, and hereafter, are anticipated to have extended applications in the field of automobiles. The MID is a device in which a three-dimensional circuit is formed by a metallic film on a surface of a molding (molded body, molded product), and is capable of contributing to making a product light-weight and thin, and to reduction of number of components.

An MID in which a light emitting diode (LED) is mounted has been proposed. Since an LED generates heat when an electric power is supplied, it is necessary to exhaust the heat from a rear surface, thereby making it significant to improve a heat dissipation property of the MID.

In Patent Literature 1 (Japanese Patent No. 3443872 Publication), a composite component in which an MID and a heat dissipating material are integrated, has been proposed. According to Patent Literature 1, this composite component has achieved both, the heat dissipation property and the small-sizing of MID. However, an adhesion between a metal having a high heat dissipation property and a resin material is low in general. In Patent Literature 2 (Japanese Patent Application Laid-open Publication No. 2009-6721 corresponding to U.S. Patent Application Publication No. 2006/127684), a nano molding technology (NMT) for improving the adhesion between a metal and a resin material has been proposed. In the nano molding technology (NMT), a surface of a metal is roughened chemically, and upon providing asperities of nano level to the roughened surface, the roughened surface is integrated with a resin material. According to Patent Literature 2, when the nano molding technology (NMT) is used, a contact area of a joint (bonded, cemented) surface of the metal and the resin material is enlarged remarkably, thereby improving the adhesion, and the metal and the resin material are suppressed from being exfoliated (detached, peeled off) in a heat-shock test, and the heat dissipation property is also improved. In Patent Literature 3 (Japanese Patent No. 5681076 Publication), a heat-dissipating lamp for LED which is manufactured by joining (cementing) a metal and a resin material, by using the nano molding technology (NMT) has been proposed.

However, in recent years, electronic devices have been becoming small-sized with an improved performance. High densification and high functionality of MIDs used in the electronic devices have also been progressed, and higher heat dissipation property of the MIDs has been sought. The present teaching is aimed at solving these problems, and provides a three-dimensional molded circuit component which has a high heat dissipation property, and moreover, which is easy to mold and has a high productivity.

SUMMARY OF THE INVENTION

According to a first aspect of the present teaching, there is provided a three-dimensional molded circuit component, including a base member which includes a metal part and a resin part, a circuit pattern which is formed on the resin part, and a mounted component (mounted part) which is mounted on the base member and is electrically connected to the circuit pattern, wherein the resin part includes a resin thin film as a portion thereof, which includes a thermoplastic resin, of which a thickness is in the range of 0.01 mm to 0.5 mm, and which is formed on the metal part, and the mounted component is arranged (disposed) on the metal part via the resin thin film.

In the present aspect, an area of the resin thin film per mounted component that is arranged on the resin thin film may be in the range of 0.1 cm$^2$ to 25 cm$^2$. The base member may be an integrated molding of the metal part and the resin part.

According to a second aspect of the present teaching, there is provided a three-dimensional molded circuit component including a base member which includes a metal part and a resin part, a circuit pattern which is formed on the resin part, a resin thin film which is formed on the metal part, and which includes one of a thermosetting resin (heat-curable resin) and a photo-curable (photo-curing) resin, and a mounted component which is mounted on the resin thin film, and is electrically connected to the circuit pattern.

In the present aspect, a thickness of the resin film may be in the range of 0.01 mm to 0.5 mm. Moreover, the resin thin film may contain a heat dissipating material having an insulation property.

In the first aspect and the second aspect of the present teaching, the resin part may include foamed cells, and moreover, the resin thin film may not include the foamed cells essentially (practically). The metal part may be a heat dissipating fin. The mounted component may be an LED. A nickel phosphorous film may be formed on a surface of the metal part.

In the first aspect and the second aspect of the present teaching, on the base member, a recess may be defined by a side wall formed by the resin part and a base (bottom) formed by the resin film, and the mounted component may be mounted in the recess, and a shape and an area of the base (bottom) of the recess may be substantially same as a shape and an area of a surface of the mounted component which is in contact with the base (bottom).

DESCRIPTION OF THE PREFERRED EMBODIMENT

Figure 1:
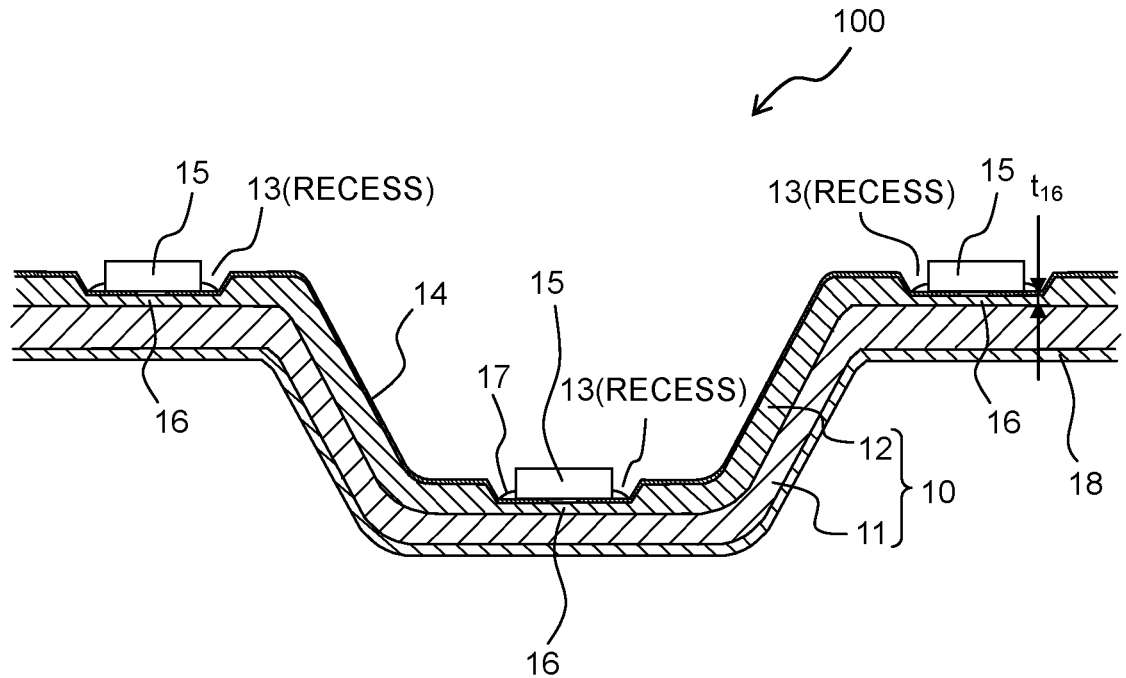
FIG. 1 is a cross-sectional schematic diagram of a three-dimensional molded circuit component manufactured according to a first embodiment.

First Embodiment (1) Three-Dimensional Molded Circuit Component

In the present embodiment, a three-dimensional molded circuit component 100 shown in FIG. 1 will be described. The three-dimensional molded circuit component 100 includes a base member 10 which includes a metal part 11 and a resin part 12, a circuit pattern 14 which is formed on the resin part 12 by a plating film, and a mounted component 15 which is mounted in a recess 13 formed in the base member 10, and is electrically connected to the circuit pattern 14. As shown in FIG. 2, a side wall 13a of the recess 13 is formed by the resin part 12, and a base (bottom) 13b of the recess 13 is formed by a resin thin film 16. The mounted component 15 is arranged (disposed) on the metal part 11 via the resin thin film 16. In the present embodiment, the resin thin film 16 is a portion of the resin part 12. Therefore, the resin thin film 16 is formed of the same resin as that in the resin part 12.

As the base member 10, it is possible to use an arbitrary base member, provided that the base member is a composite body in which the metal part 11 and the resin part 12 are joined, and in the present embodiment, an integrated molding in which the metal part 11 and the resin part 12 have been molded integrally is used. Here, 'molded integrally' refers to a process of joining members at the time of molding the members (a typical insert molding), and not sticking (gluing) or joining the members that have been prepared separately (secondary gluing or mechanical joint).

The metal part 11 dissipates heat generated by the mounted component 15 mounted on the base member 10. Therefore, it is preferable to use a metal having a heat dissipation property for the metal part 11, and it is possible to use metals such as iron, copper, aluminum, titanium, magnesium, and stainless steel (SUS). Among these metals, it is preferable to use magnesium and aluminum from a point of view of weight reduction, heat dissipation property, and cost. These metals may be used independently or may be used upon mixing two or more types.

The resin part 12 insulates the circuit pattern 14 formed thereon and the metal part 11 which is an electrical conductor. For the resin part 12, it is preferable to use a thermoplastic resin with a high melting point which is heat-resistant and has a solder reflow resistance. For instance, it is possible to use aromatic polyamides such as nylon 6T (PA6T), nylon 9T (PA9T), nylon 10T (PA10T), nylon 12T (PA12T), nylon MXD6 (PAMXD6) and the like, and alloy materials thereof, polyphenylene sulfide (PPS), liquid crystal polymers (LCP), polyether ether ketone (PEEK), polyether imide (PEI), and the like. These thermoplastics may be used independently or may be used upon mixing two or more of these. Moreover, in the present embodiment, the resin thin film 16 on which the mounted component 15 is mounted by soldering is a portion of the resin part 12. Therefore, it is preferable that the melting point of a resin to be used for the resin part 12 is 260° C. or more in order to enable soldering, and it is more preferable that the melting point is 290° C. or more. However, the melting point is not restricted to the abovementioned temperatures in a case of using a low-temperature solder for mounting the mounted component 15. Moreover, from a point of view of dimensional stability and improvement in rigidity, the abovementioned thermoplastic resins may contain an inorganic filler such as glass filler, a mineral filler, and the like.

It is possible to let the size and shape of the metal part 11 and the resin part 12 to be an arbitrary size and shape in accordance with an application of the three-dimensional molded circuit component 100. The circuit pattern 14 being formed three-dimensionally (stereoscopically) on the resin part 12, the resin part 12 either has a plurality of surfaces or has a three-dimensional surface including a spherical surface and the like. In the present embodiment, the resin part 12 which is a thermoplastic-resin layer is molded integrally on the metal part 11 which is a curved metal plate. Accordingly, the thermoplastic-resin layer (resin part 12) is curved along the metal plate (metal part 11) that is curved, and has a plurality of surfaces. From a point of view of the heat dissipation property, a thickness $t_{11}$ of the metal plate (metal part 11) is 0.5 mm or more, and it is preferable that the thickness $t_{11}$ is 1 mm or more, whereas from a point of view of reduction in cost and weight, and improvement in machining, the thickness $t_{11}$ is 20 mm or less, and it is preferable that the thickness $t_{11}$ is 10 mm or less. Here, the thickness $t_{11}$ of the metal plate (metal part 11) refers to a thickness in a direction perpendicular to an interface with the resin part 12. From a point of view of ease of molding, a thickness $t_{12}$ of the thermoplastic-resin layer (resin part 12) is 0.5 mm or more, and it is preferable that the thickness $t_{12}$ is 1 mm or more, whereas, from a cost point of view, the thickness $t_{12}$ is 5 mm or less, and it is preferable that the thickness $t_{12}$ is 3 mm or less. Here, the thickness $t_{12}$ of the thermoplastic-resin layer (resin part 12) refers to a thickness of a portion other than the recess 13 on which the mounted component 15 is to be mounted, and is a thickness in a direction perpendicular to an interface with the metal part 11. Moreover, the thermoplastic-resin layer (resin part 12) being provided for insulating the circuit pattern 14 and the metal part 11, the thermoplastic-resin layer (resin part 12) may not be provided to a portion on which the circuit pattern 14 has not been formed.

In the present embodiment, the metal part 11 is not restricted to a metal plate, and it is also possible to use a metal having a complex shape molded by die-casting.

Since the circuit pattern 14 is to be formed on the resin part 12 which is an insulator, it is preferable that the circuit pattern 14 is formed by electroless plating. Therefore, the circuit pattern 14 may include an electroless plating film such as an electroless nickel phosphorous plating film, an electroless copper plating film, an electroless nickel plating film and the like, and among these, it is preferable that the circuit pattern 14 includes the electroless nickel phosphorous plating film. When the circuit pattern 14 is formed of the electroless nickel phosphorous plating film, it is possible to simultaneously form a nickel phosphorous film (electroless nickel phosphorous plating film) 18 on a surface of the metal part 11, and it is possible to improve a corrosion resistance of the metal part 11. In the circuit pattern 14, another type of electroless plating film or electrolytic plating film may be stacked in addition, on the electroless plating film. By making a total thickness of the plating film thick, it is possible to make small an electrical resistance of the circuit pattern 14. From a point of view of lowering the electrical resistance, it is preferable that the plating film to be stacked on the electroless plating film is an electroless copper plating film, an electrolytic copper plating film, an electrolytic nickel plating film, and the like. Moreover, for improving a solder wettability of the plating film in order to withstand the solder reflow, a plating film of a metal such as tin, gold, silver, and the like may be formed on the outermost surface of the circuit pattern 14.

The circuit pattern 14 is formed three-dimensionally along a surface having a three-dimensional shape including a spherical surface and the like or over the plurality of surfaces of the resin part 12. The circuit pattern 14 is a three-dimensional electric circuit having conductivity, which is formed three-dimensionally along the surface having a three-dimensional shape including a spherical surface and the like or over the plurality of surfaces of the resin part 12. Since the circuit pattern 14 is to be electrically connected to the mounted component 15 mounted in the recess 13, the circuit pattern 14 may be formed on the side wall 13a and the base (bottom) 13b of the recess.

The mounted component 15 is electrically connected to the circuit pattern 14 by a solder 17, and becomes a heat-generating source by generating heat by the supply of electric power. An LED (light emitting diode), a power module, an IC (integrated circuit), and a thermal resistance, and the like can be cited as examples of the mounted component 15. In the present embodiment, an LED is used as the mounted component 15. The three-dimensional molded circuit component 100 of the present embodiment is capable of dissipating effectively the heat generated by the LED even when an LED which generates a large amount of heat is used as the mounted component. Moreover, the LED radiates (generates) heat from a rear surface on an opposite side of a light-emitting surface. By arranging the metal part 11 which is a heat dissipating member on a rear surface side of the LED (mounted component 15), the three-dimensional molded circuit component 100 of the present embodiment is capable of dissipating effectively the heat generated by the LED.

The mounted component 15 is mounted in the recess 13 formed on the base member 10. One mounted component 15 may be mounted for (with respect to) one recess 13, or a plurality of mounted components 15 may be mounted for (with respect to) one recess 13. The side wall 13a of the recess 13 is formed by the resin part 12 and the base 13b of the recess 13 is formed by the resin thin film 16. The mounted component 15 is arranged (disposed) on the metal part 11 via the resin thin film 16. In the present embodiment, the resin think film 16 is a portion of the resin part 12. In other words, in the present embodiment, the recess 13 is formed in the thermoplastic resin layer (resin part 12), and the resin thin film 16 is a portion, having a thin thickness, of the thermoplastic resin layer. Therefore, the resin thin film 16 is formed of a thermoplastic resin same as that in the resin portion 12. In the present embodiment, the metal part 11, and resin part 12 which includes the resin thin film 16 form the base member 10.

From a point of view of heat dissipation, it is desirable to arrange (dispose) the mounted component 15 directly on the meal part 11. However, the direct mounting is difficult, as it is necessary to insulate the mounted component 15 and the metal part 11. In the present embodiment, by arranging (disposing) the mounted component 15 on the metal part 11 via the thin resin thin film 16, both of the insulation between the mounted component 15 and the metal part 11 and the heat dissipation are achieved.

A thickness $t_{16}$ of the resin thin film 16 is in the range of 0.01 mm to 0.5 mm. Since a resin material has heat insulating properties, when the thickness $t_{16}$ of the resin thin film 16 is about 1 mm to 5 mm which is a thickness of a normal injection molding, the heat dissipation property is inadequate. By letting the thickness $t_{16}$ of the resin thin film 16 to be 5 mm or less, it is possible to dissipate more adequately the heat generated by the mounted component 15, by the metal part 11. Moreover, since the mounted component 15 is electrically connected to the circuit pattern 14, a wiring may be formed by a plating film even on the resin thin film 16. As it will be described later in detail, since laser drawing (laser lithography) is used for forming wiring made of (including) plating film, the resin thin film 16 is required to have a thickness that will not allow piercing through the film by the laser drawing. Furthermore, the resin thin film 16 of the present embodiment being formed by a method such as insert molding, and the like, is required to have a thickness that allows the molten resin to flow. When the thickness $t_{16}$ of the resin thin film 16 is 0.01 mm or more, formation of the wiring using the laser drawing on the resin thin film 16 is possible, and molding of the resin thin layer 16 using the insert-molding is also possible. From the point of view described above, it is preferable that the thickness $t_{16}$ of the resin thin film 16 is in the range of 0.1 mm to 0.2 mm.

In a case in which the thickness $t_{16}$ of the resin thin film 16 is not uniform, an average value (average thickness) of the resin thin film 16 is in the range of 0.01 mm to 0.5 mm, and preferably in the range of 0.1 mm to 0.2 mm. It is possible to find the average value of the thickness (average thickness) of the resin thin film 16 by measuring the thickness of the resin thin film 16 at three locations or more than three locations of a cross-section of the resin thin film 16 in a direction perpendicular to the interface of the resin thin film 16 and the metal part 11, and calculating an average of the measured values. Moreover, even in the case in which the thickness of the resin thin film 16 is not uniform, it is preferable that the thickness $t_{16}$ of the resin thin film 16 fluctuates (varies) in the range of 0.01 mm to 0.5 mm, it is more preferable that the thickness t16 fluctuated (varies) in the range of 0.1 mm to 0.2 mm. In other words, a region in which the thickness $t_{16}$ is in the range of 0.01 mm to 0.5 mm, and preferably is in the range of 0.1 mm to 0.2 mm, may be the resin thin film 16.

It is preferable that an area of the resin thin film 16, or in other words, an area of the base 13b of the recess 13 is in the range of 0.1 $cm^2$ to 25 $cm^2$ per the mounted component 15 arranged on the resin thin film 16. The wider the area of the resin thin film 16, the higher is the heat dissipation effect, but the molding becomes difficult. When the area of the resin thin film 16 is within the abovementioned range, it is possible to achieve both of the high heat dissipation effect and the ease of molding. In the present embodiment, the resin thin film 16 having a high heat dissipation property is restricted (limited) to a portion on which the mounted component 15 is (to be) mounted. Accordingly, a thin-film portion that is hard to mold is minimized, and the ease of molding is improved, and as a result, the productivity of the three-dimensional molded circuit component is improved.

In the present embodiment, the area of the resin thin film 16, as shown in FIG. 2, is an area of a region $S_{16}$ having a thickness $t_{16}$ which is thinner than the thickness $t_{12}$ of the surrounding resin par 12, and is the area of the base 13*b* of the recess 13. The region $S_{16}$ is not restricted (limited) to a region which is in contact with the mounted component 15, and may be a region wider than a region $S_{15}$ which is in contact with the mounted component 15 as shown in FIG. 2.

Figure 3:
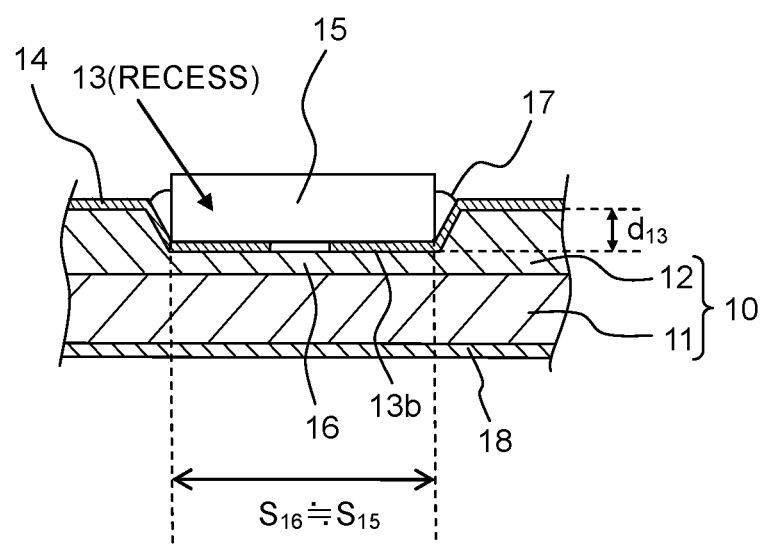
FIG. 3 is a cross-sectional schematic diagram of another example of the three-dimensional molded circuit component manufactured according to the first embodiment.

It is possible to use the recess 13 as a recess for determining a mounting position of the mounted component 15. In a three-dimensional circuit (stereoscopic circuit), the mounting position of the mounted component has to be determined in three directions, and determining the mounting positions is difficult as compared to that in a two-dimensional circuit (planar circuit). In the three-dimensional molded circuit component 100 of the present embodiment, by letting the mounting position of the mounted component 15 to be a recess, detection of the mounting position becomes easy. In a case of using the recess 13 as a recess for positioning the mounted component 15, it is preferable to mount one mounted component 15 for (with respect to) one recess 13, and it is preferable that a shape and an area of the base (bottom) 13*b* of the recess 13 are substantially same as a shape and an area of a surface of the mounted component 15 which is in contact with the base 13*b*, as shown in FIG. 3. In this case, the area of the resin thin film 16 (area of the region $S_{16}$) is substantially same as the area of the region $S_{15}$ which is in contact with the mounted component 15 as shown in FIG. 3. Accordingly, determining the mounting position of the mounted component 15 becomes further easier. From a point of view of easing determining the mounting position of the mounted component 15, it is preferable that a depth $d_{13}$ of the recess 13 is in the range of 0.1 mm to 5 mm.

A nickel phosphorous film 18 may be formed on the surface of the metal part 11 of the present embodiment. Since the nickel phosphorous film 18 has a high corrosion resistance, the corrosion resistance of the metal part 11 is improved.

(2) Method of Manufacturing Three-Dimensional Molded Circuit Component

A method of manufacturing the three-dimensional molded circuit component 100 will be described below. Firstly, the base member 10 which includes the metal part 11 and the resin part 12 is manufactured. In the present embodiment, the base member 10 is manufactured by the insert molding (integrated molding) in which, the resin part 12 is molded by injection-filling a thermoplastic resin in a mold in which the metal part 11 has been arranged in advance. For improving an adhesion of the metal part 11 and the resin part 12, the nano molding technology (NMT), for example, disclosed in Patent Literature 2 or 3, may be used. Moreover, as another method for improving the adhesion of the metal part 11 and the resin part 12, a surface shape of the metal part 11 and a surface shape of the resin part 12 may be let to be shapes that are not separated (disengaged) physically.

In the present embodiment, the resin thin film 16 is a portion of the resin part 12, and the recess 13 is formed in the surface of the resin part 12. Therefore, in the present embodiment, the resin part 12 which includes the resin thin film 16 is molded by using a mold in which a projection corresponding to the recess 13 is formed inside the cavity.

Next, the circuit pattern 14 which was formed by the plating film on the resin part 12 is formed. A method for forming the circuit pattern 14 is not restricted to any particular method, and it is possible to use a general-purpose method. Methods such as a method of patterning on a plating film by a photoresist, and removing the plating film on a portion other than the circuit pattern by etching, a method of roughening a base member by irradiating laser light on a portion on which the circuit pattern has been formed, or a method of forming the plating film only on a portion irradiated by laser light by applying a functional group and the like can be cited as the method for forming the circuit pattern 14.

In the present embodiment, the circuit pattern 14 is formed by a method described below. Firstly, a catalytic activity inhibiting layer is formed on the surface of the resin part 12. Next, a portion on which an electroless plating film is to be formed, or in other words, a portion on which the circuit pattern 14 is to be formed, is laser-drawn on the surface of the resin part 12 having the catalytic activity inhibiting layer formed thereon. An electroless plating catalyst is applied to the surface of the resin part 12 subjected to laser drawing, and next, is brought into contact with an electroless plating solution. In this method, the catalytic activity inhibiting layer hinders (inhibits) the catalytic activity of the electroless plating catalyst applied thereon. Consequently, formation of the electroless plating film is suppressed on the catalytic activity inhibiting layer. Whereas, the inhibiting layer being removed from the laser-drawn portion, the electroless plating film is formed on the laser-drawn portion. Accordingly, the circuit pattern 14 is formed by the electroless plating film on the surface of the resin part 12.

It is preferable that the catalytic activity inhibiting layer includes a polymer having at least one of an amide group and an amino group (hereinafter, appropriately referred to as amide group and/or amino group-containing polymer). The amide group and/or amino group-containing polymer act(s) as a catalytic activity inhibitor which hinders (inhibits) or lowers (weakens) the catalytic activity of the electroless plating catalyst. Although the mechanism of how the amide group and/or amino group-containing polymer hinder(s) the catalytic activity of the electroless plating catalyst is not clear, the amide group and the amino group are adsorbed, coordinated, or react with an electroless plating catalyst, and accordingly, it is presumed that the electroless plating catalyst cannot act as a catalyst.

It is possible to use (an) arbitrary amide group and/or amino group polymer, but from a point of view of hindering the catalytic activity of a electroless plating catalyst, a polymer containing the amide group is preferable, and moreover, a branched polymer having a side chain is preferable. In the branched polymer, it is preferable that the side chain includes at least one of the amide group and the amino group, and it is more preferable that the side chain includes the amide group. It is preferable that the branched polymer is a dendritic polymer. Dendritic polymers are polymers formed by a molecular structure in which regular branches are repeated frequently (at short intervals), and are classified into dendrimers and hyper branched polymers. A dendrimer is a polymer which has an orderly and perfectly dendritic-branched structure with a molecule which is a core, as a center, and is a polymer of a spherical shape having a diameter of a few nm, whereas a hyper branched polymer, unlike a dendrimer having a perfectly dendritic-branched structure, is a polymer which has imperfect dendritic branches. Even among the dendritic polymers, the hyper branched polymers being comparatively easier to synthesize as well as low-priced, are preferable as the branched polymer of the present embodiment.

The laser light and the electroless plating catalyst to be used for laser drawing are not restricted in particular, and it is possible to use a general-purpose laser light and a general-purpose plating catalyst upon selecting appropriately.

The electroless plating solution is not restricted in particular, and it is possible to use a general-purpose electroless plating solution upon selecting appropriately. However, according to the reasons described below, a neutral electroless nickel phosphorous plating solution is preferable. Here, the neutral electroless nickel phosphorous plating solution refers to an electroless nickel phosphorous plating solution with a pH in the range of 5.5 to 7.0. According to the study of the inventors, it was revealed that the metal part 11, depending on the type of a metal used, is eroded by the electroless plating solution, and there is a possibility (risk) that the metal part 11 is corroded. For instance, when an alkaline electroless plating solution is used, although there is no corrosion in a case in which magnesium is used for the metal part 11, there is corrosion in a case in which aluminum is used for the metal part 11. Whereas, when a neutral electroless nickel phosphorous solution is used, it is possible to suppress the corrosion of aluminum. Therefore, by using the electroless nick phosphorous plating solution, the range of choice of a metal to be used for the metal part 11 is broadened, and it is possible to use aluminum which is cheaper in cost than magnesium, for the metal part 11. Moreover, from a point of view of improving a plating reactivity, a mildly acidic electroless nickel phosphorous plating solution having pH in the range of 4.0 to 5.5 may be used. In this case, since a speed of growing a nickel phosphorous plating film on an aluminum surface becomes faster than a speed of eroding of aluminum due to an acidic solution, it is possible to coat the plating film, and there is no damage caused to aluminum. Although it has been known that corrosion resistance of aluminum is improved by an anodic oxidation method (alumite treatment) of forming an oxide layer on the surface thereof, the alumite treatment becomes a cause of rise in the cost. In the present embodiment, even without using the alumite treatment, by using the electroless nickel phosphorous plating solution for forming the circuit pattern 14, it is possible to form the nickel phosphorous film 18 on the surface of aluminum simultaneously with the formation of the circuit pattern 14, and it is possible to improve the corrosion resistance of the metal part 11.

In the formation of the circuit pattern 14, an electroless plating film of other types and an electrolytic plating film may be stacked on the electroless plating film. At this time, in a case in which the nickel phosphorous film 18 has been formed on the surface of the metal part 11, it is possible to suppress the corrosion of the metal part 11 by the other electroless plating solution or the electrolytic plating solution.

After forming the circuit pattern 14 on the resin part 12, the mounted component 15 is mounted in the recess 13 formed in the base member 10, and is electrically connected to the circuit pattern 14. Accordingly, it is possible to achieve the three-dimensional molded circuit component 100 of the present embodiment. A method for mounting is not restricted in particular, and it is possible to use a general-purpose method. The mounted component 15 may be soldered to the base member 10 by a solder reflow method in which the base member 10 having the mounted component 15 arranged thereon is passed through a high-temperature reflow furnace or a laser soldering method (spot mounting) in which the soldering is carried out by irradiating laser light to an interface between the base member 10 and the mounted component 15.

Figure 4A:
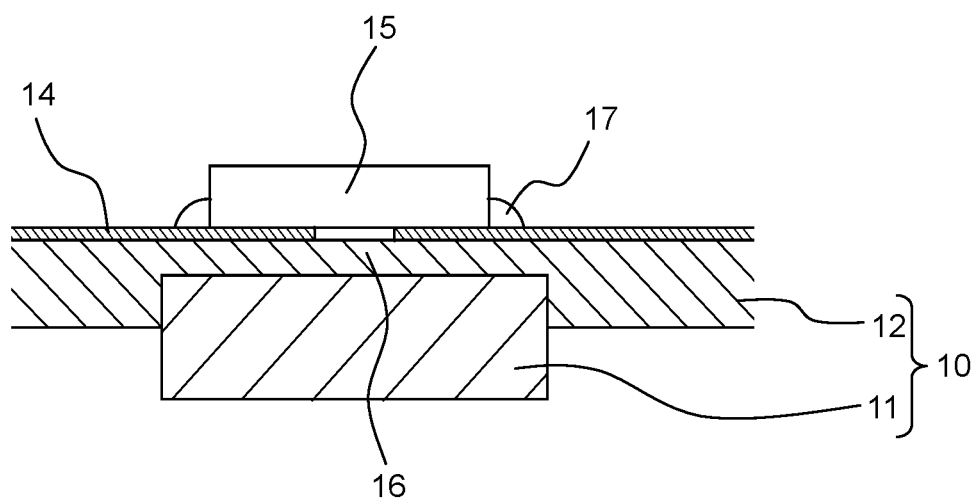
FIG. 4A and FIG. 4B are cross-sectional schematic diagrams of still other examples of the three-dimensional molded circuit components manufactured according to the first embodiment.
Figure 4B:
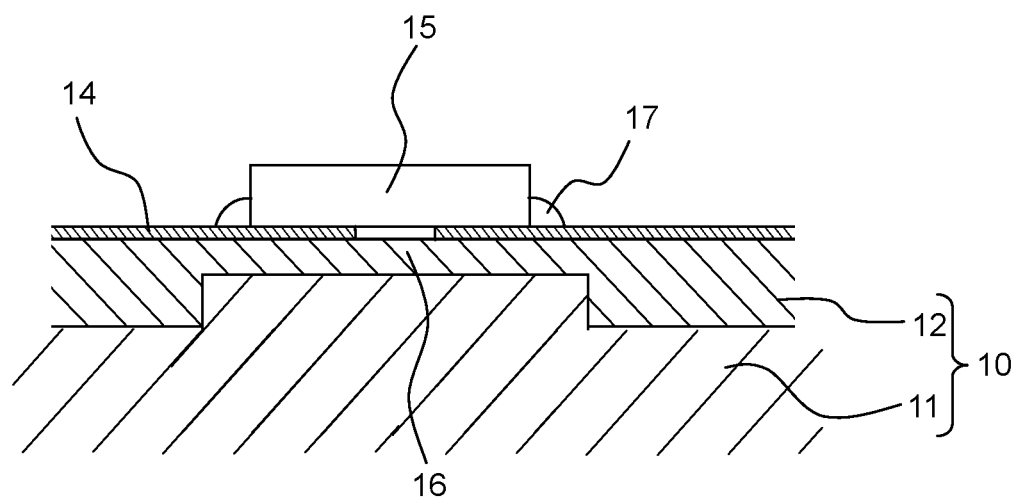

In the three-dimensional molded circuit component 100 of the present embodiment described heretofore, the mounted component 15 is mounted in the recess 13 formed in the base member 10. However, the present embodiment is not restricted to such mounting. For instance, as shown in FIG. 4A and FIG. 4B, when the mounted component 15 is arranged (disposed) on the metal part 11 via the resin thin film 16 having a thickness in the range of 0.01 mm to 0.5 mm, the mounted component 15 is not necessarily required to be mounted in the recess. Even when the mounted component 15 is not mounted in the recess, by mounting the mounted component 15 in the resin thin film 16, it is possible to dissipate adequately the heat generated by the mounted component 15.

As described above, the present teaching provides a three-dimensional molded circuit component which has a high heat dissipation property, and moreover, which can be molded easily and which has a high productivity.

Modified Embodiment 1

Figure 5:
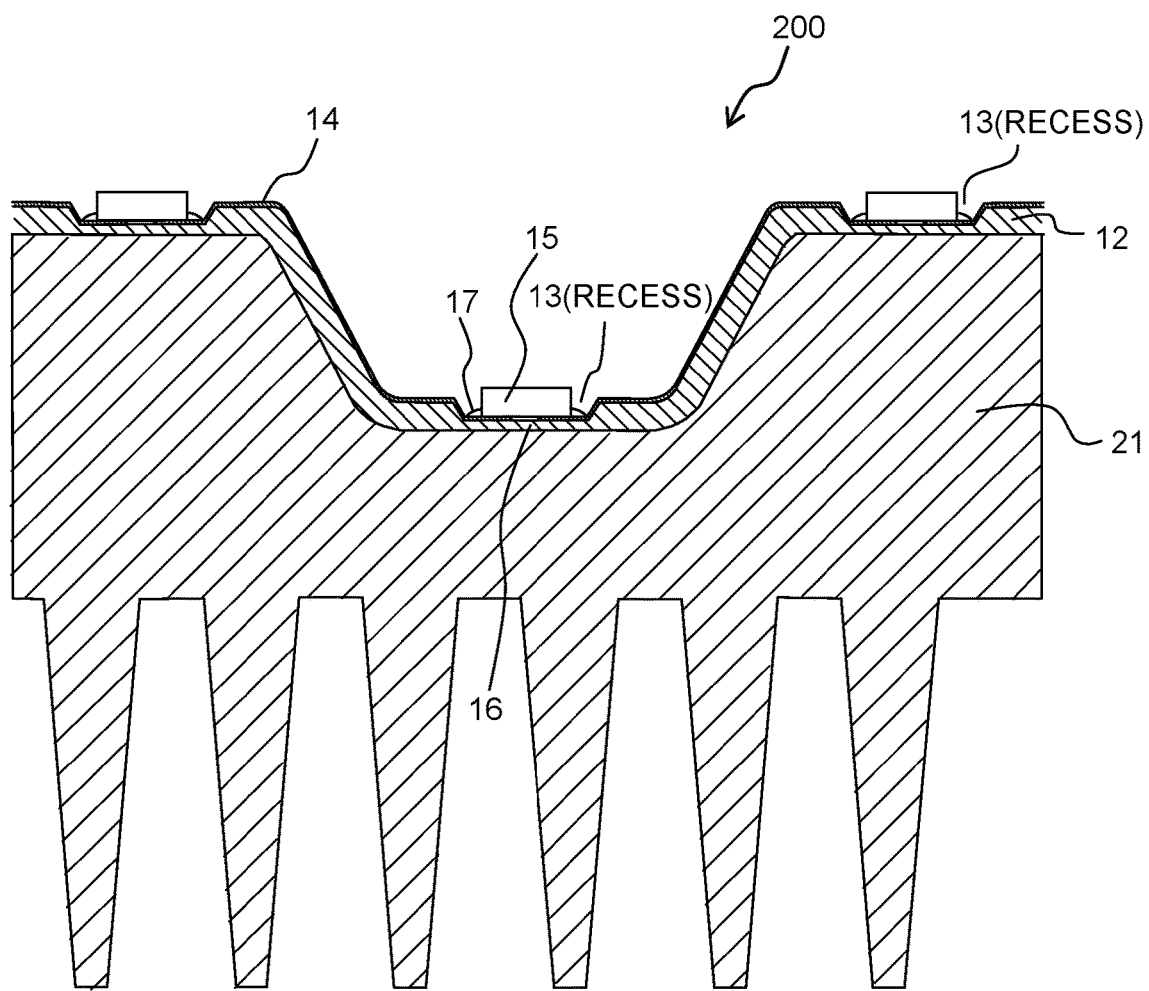
FIG. 5 is a cross-sectional schematic diagram of a three-dimensional molded circuit component manufactured according to a modified embodiment 1 of the first embodiment.

Next, a modified embodiment 1 of the present embodiment, shown in FIG. 5 will be described below. In the abovementioned three-dimensional molded circuit component 100 shown in FIG. 1, the curved metal plate was used as the metal part 11, whereas, in a three-dimensional molded circuit component 200 of the modified embodiment 1, a heat dissipating fin is used as the metal part 21. An arrangement of the three-dimensional molded circuit component 200 is similar to the arrangement of the three-dimensional molded circuit component 100, except for the heat dissipating fin which is used as the metal part 21. It is possible to manufacture the three-dimensional molded circuit component 200 by a method similar to that of the three-dimensional molded circuit component 100 except for using the heat dissipating fin as the metal part 21. In the three-dimensional molded circuit component 200, by using the heat dissipating fin as the metal part 21, it is possible to improve further the heat dissipation effect.

Modified Embodiment 2

Figure 6:
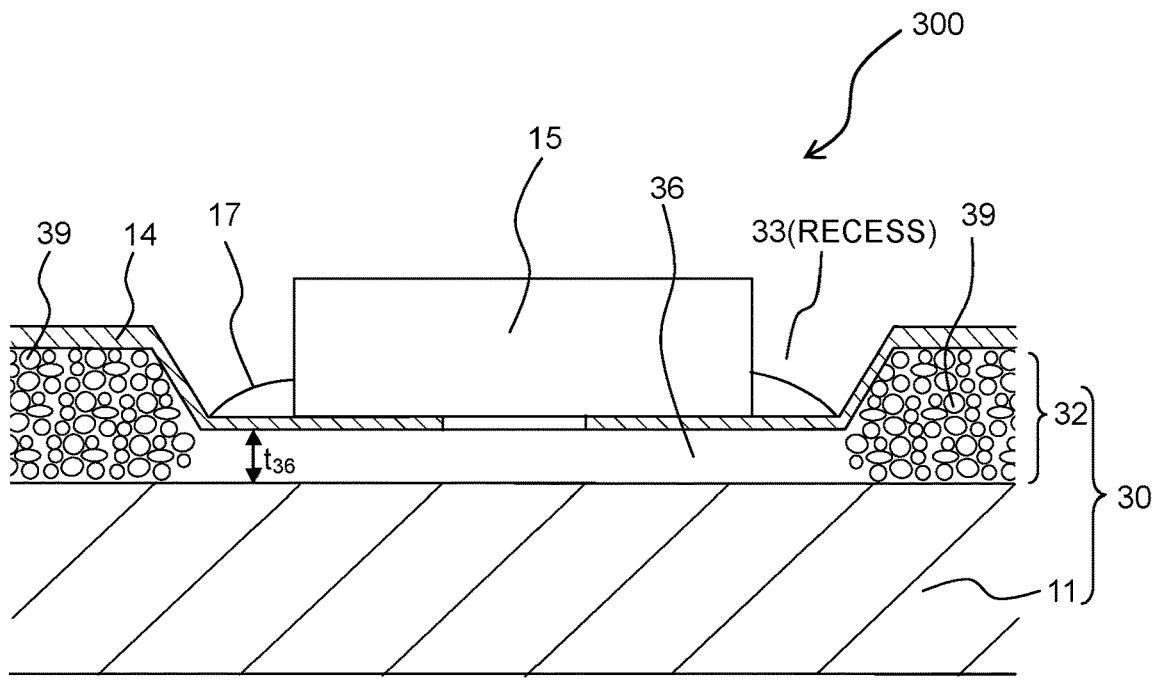
FIG. 6 is a cross-sectional schematic diagram of a three-dimensional molded circuit component manufactured according to a modified embodiment 2 of the first embodiment.

Next, a modified embodiment 2 of the present embodiment shown in FIG. 6 will be described below. In a three-dimensional molded circuit component 300 shown in FIG. 6, a resin part 32 includes foamed cells 39. Whereas, a resin thin film 36 does not essentially (practically) include the foamed cells 36. Here, the phrase "the resin thin film 36 does not essentially include the foamed cells" includes a case in which the resin thin film 36 includes foamed cells in a small amount to an extent that does not have an adverse effect on the heat dissipation property of the resin thin film 36 and at the time of reflow, in addition to a case in which the resin thin film 36 does not include any foamed cell 36. In other words, even when the foamed cells are included in the resin thin film 36, an amount thereof is small, and a density of the foamed cells included in the resin thin film 36 is lower than a density of the foamed cells 39 included in the resin part 32 in a portion other than the resin thin film 36. An arrangement of the three-dimensional molded circuit component 300 is similar to that of the three-dimensional molded circuit component 100, except for the resin part 32.

By the resin part 32 of the three-dimensional molded circuit component 300 of the present embodiment having the foamed cells 39, the weight-reduction of the overall component and improvement in the dimensional precision are facilitated. On the other hand, since the resin thin film 36 does not essentially include the foamed cells 39, the heat dissipation property of the resin thin film 36 is maintained.

A method of manufacturing the three-dimensional molded circuit component 300 of the present embodiment will be described below. Firstly, a base member 30 which includes the metal part 11 and a resin part 32 is manufactured by the integrated molding. At this time, the resin part 32 is foam-molded. It is preferable to foam-mold the resin part 32 by using a physical foaming agent such as carbon dioxide, nitrogen, and the like. Chemical foaming agents and physical foaming agents are the types of foaming agents, and a decomposition temperature for the chemical foaming agents being lower, it is difficult to foam a resin material having a high melting point. It is preferable to use a resin with a high melting point and a high heat resistance. When a physical foaming agent is used, it is possible to foam-mold the resin part 32 by using a resin having a high melting point. As a method of molding using a physical foaming agent, it is possible to use MuCell (registered trademark) in which a supercritical fluid and a low-pressure foam-molding method (described in WO2013/027615 Publication) proposed by the inventors, which does not require a high-pressure equipment.

In the present modified embodiment, in molding of the resin part 32, a molten resin viscosity is lowered by dissolving the physical foaming agent in the molten resin. Accordingly, a fluidity of a molten resin in a narrow region corresponding to the resin thin film 36 in a mold cavity is induced, and molding of the resin thin film 36 becomes easy. Moreover, in the narrow region corresponding to the resin thin film 36 in the mold cavity, a solidification speed of the molten resin being fast (high), the foamed cells are hard to grow. Accordingly, in the resin thin film 36, the foamed cells 39 are essentially hard to be formed. From a point of view of suppressing the formation of the foamed cells in the resin thin film 36, it is preferable that a thickness $t_{36}$ of the resin thin film 36 is in the range of 0.01 mm to 0.3 mm, and the thickness $t_{36}$ in the range of 0.01 mm to 0.2 mm is more preferable, and the thickness $t_{36}$ in the range of 0.01 mm to 0.1 mm is even more preferable.

Next, by a method similar to that of the abovementioned three-dimensional molded circuit component 100, the circuit pattern 14 formed by the plating film is formed on the resin part 32. After forming the circuit component 14, the mounted component 15 is mounted in a recess 33 formed in the base material 30, and is electrically connected to the circuit pattern 14. Accordingly, it is possible to achieve the three-dimensional molded circuit component 300 of the present embodiment. In the present modified embodiment, it is preferable to mount the mounted component 15 by the laser soldering method (spot mounting). For instance, in a case of mounting the mounted component 15 by the solder reflow method, it is necessary to pass the base member 30 through the reflow furnace at a temperature of 230° C. to 240° C. or more. At this time, even when a thermoplastic resin having a melting point higher than the reflow temperature is used for the resin part 32, there is a possibility that a surface of the resin part 32 which is a foamed-mold is bloated (bulged, swelled) due to an expansion (bloating) of moisture and the like at the interior. Whereas, in the laser soldering method (spot mounting), the range which attains high temperature is minimized. Since a portion to which the laser light is irradiated is the resin thin film 36 in which no foaming cells exist essentially (practically), the bloating (bulging, swelling) of the surface thereof is hard to occur even when heated by the laser light.

Second Embodiment (1) Three-Dimensional Molded Circuit Component

Figure 7:
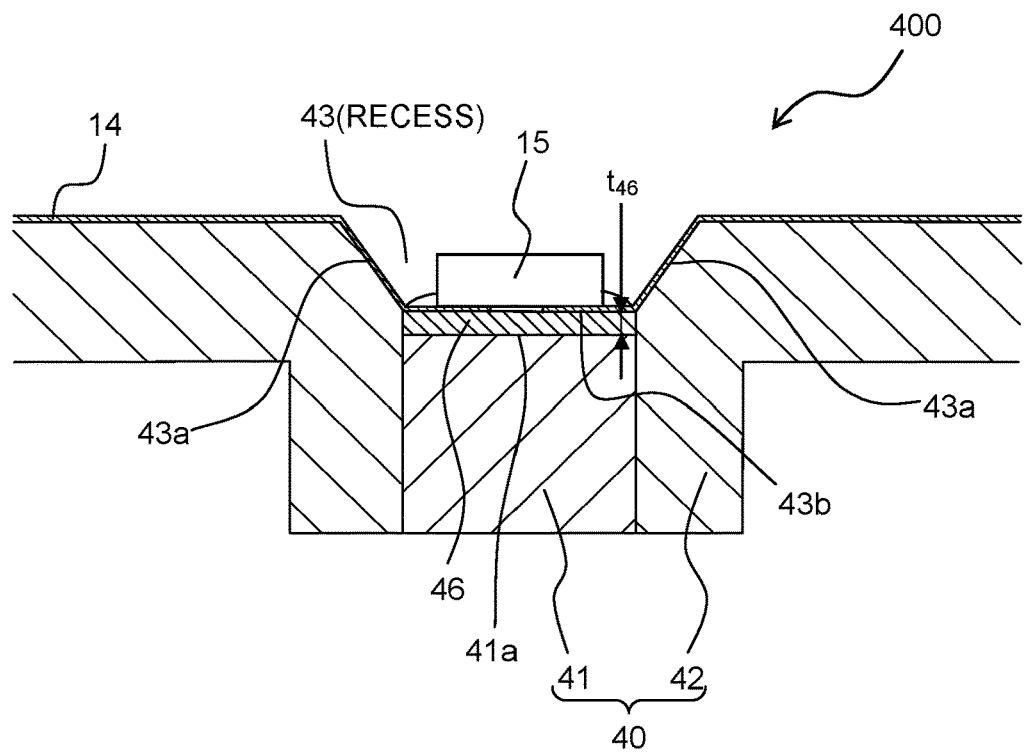
FIG. 7 is a cross-sectional schematic diagram of a three-dimensional molded circuit component manufactured according to a second embodiment.

In the present embodiment, a three-dimensional molded circuit component 400 shown in FIG. 7 will be described. The three-dimensional molded circuit component 400 has a base member 40 which includes a metal part 41 and a resin part 42, the circuit pattern 14 which is formed on the resin part 42 by a plating film, and the mounted component 15 which is mounted in a recess 43 formed in the base member 40, and is electrically connected to the circuit pattern 14. A side wall 43*a* of the recess 43 is formed by the resin part 42, and a base 43*b* of the recess 43 is formed by a resin thin film 46. The mounted component 15 is arranged (disposed) on the metal part 41 via the resin thin film 46. In the first embodiment, as shown in FIG. 1, the resin thin film 16 is a portion of the resin part 12, and is formed by a thermoplastic resin. Whereas, in the present embodiment, as shown in FIG. 7, the resin thin film 46 is not a portion of the resin part 42, and is formed by a heat-curable (thermosetting) resin or a photo-curable resin.

It is possible to use an arbitrary base member for the base member 40, similarly as in the first embodiment, provided that the base member is a composite body in which the metal part 41 and the resin part 42 are joined. Moreover, in the first embodiment, the integrated molding in which the metal part 11 and the resin part 12 have been molded integrally was used, but the present embodiment is not restricted to the molding integrally. For instance, the base member 40 in which the metal part 41 and the resin part 42 are joined by a joining technology using a triazine thiol derivative, may be used.

As materials of the metal part 41 and the resin part 42, it is possible to use materials similar to those in the first embodiment. In the present embodiment, a metal block is used as the metal part 41. Moreover, in the first embodiment, the resin thin film 16 being a portion of the resin part 12, a thermoplastic resin having a high heat resistance is used for the resin part 12. However the present embodiment is not restricted to the thermoplastic resin. In the present embodiment, the resin thin film 46 and the resin part 42 being formed of different resins, it is possible to form the resin thin film 46 of a resin having a high heat resistance and to form the resin part 42 of a resin having a low heat resistance which is comparatively cheaper in price. Accordingly, it is possible to reduce an overall cost of the three-dimensional molded circuit component 400. For instance, in a case in which the mounted component 15 is not mounted on the base member by the solder reflow, since the resin part 42 is not sought to have a solder reflow resistance, it is possible to use an engineering plastic such as ABS resin (acrylonitrile butadiene styrene resin), a polycarbonate (PC), a polymer alloy of ABS resin and PC (ABS/PC) and the like. These thermoplastic resins may be used independently or may be used upon mixing two or more types thereof. Moreover, the resin part 42 of the present embodiment, similarly as the resin part 32 of the modified embodiment 2 of the first embodiment shown in FIG. 6, may have foamed cells at an interior thereof. By having the foamed cells at the interior, weight-reduction of the three-dimensional molded circuit component 400 is facilitated.

It is possible to use the circuit pattern 14 and the mounted component 15 similar to those in the first embodiment. The mounted component 15 is mounted in the recess 43 formed in the base member 40. An area of the base 43b of the recess 43 and a depth of the recess 43 are similar to the area and the depth of the recess 13 of the first embodiment.

The resin thin film 46 of the present embodiment is formed by a heat-curable resin (thermosetting resin) or a photo-curable resin. Since a heat-curable resin and a photo-curable resin before being cured, have a low viscosity, thinning of the resin thin film 46 is easy. Moreover, since a heat-curable resin and a photo-curable resin after being cured, have a high heat resistance and a high density, a heat-curable resin and a photo-curable resin are appropriate as materials for forming the base 43b of the recess 43 to which the mounted component 15 is soldered. It is preferable that the resin which forms the resin thin film 46 has a melting point of 260° C. or more, and it is more preferable that the melting point is 290° C. or more. As a heat-curable resin, it is possible to use heat-resistant resins such as an epoxy resin, a silicon resin, a polyimide resins and the like, and as a photo-curable resin, it is possible to use resins such as a polyimide resin, an epoxy resin, and the like. These heat-curable resins may be used independently, or may be used upon mixing two or more types thereof. Similarly, these photo-curable resins may be used independently, or may be used upon mixing two or more types thereof.

The resin thin film 46 may contain an insulating heat dissipating material. Since the circuit pattern 14 is formed on the resin thin film 46, it is not possible to use an inexpensive conductive heat dissipating material such as carbon. Although the insulating heat dissipating materials are expensive, by including only in the resin thin film 46 on which the mounted component 15 is to be mounted, it is possible to achieve both of suppressing a rise in cost and improvement in the heat dissipation property. As the insulating heat dissipating material, ceramic powders which is inorganic powders having a high thermal conductivity are available, and aluminum oxide, boron nitride, aluminum nitride, and the like can be cited as examples. It is preferable that the insulating heat dissipating material in the range of 10 wt % to 90 wt % is included in the resin thin film 46, and it is more preferable that the insulating heat dissipating material in the range of 30 wt % to 80 wt % is included in the resin thin film 46.

It is preferable that a thickness $t_{46}$ of the resin thin film 46 of the present embodiment is in the range of 0.01 mm to 0.5 mm. When the thickness $t_{46}$ of the resin thin film 46 existing between the mounted component 15 and the metal part 41 is in this range, it is possible to dissipate adequately the heat generated by the mounted component 15 by the metal part 41, and moreover, the laser drawing on the resin thin film 46 is also possible. From the point of view described above, furthermore, it is preferable that the thickness $t_{46}$ of the resin thin film 46 is in the range of 0.01 mm to 0.1 mm, and it is more preferable that the thickness $t_{46}$ of the resin film 46 in the range of 0.03 mm to 0.05 mm.

(2) Method of Manufacturing Three-Dimensional Molded Circuit Component

A method of manufacturing the three-dimensional molded circuit component 400 will be described below. Firstly, the resin thin film 46 which is formed of a heat-curable resin or a photo-curable resin, is formed on a surface 41a of the metal part 41 (metal block) of the base member 40. It is possible to form the resin thin film 46 by dissolving the heat-curable resin or the photo-curable resin in a solvent thereby letting to be a resin solution, and applying the resin solution to the surface 41a of the metal part 41 and drying, and thereafter, heating or photo-irradiating (exposing to light). Since the resin solution has a low viscosity, formation of the thin film is easy.

Next, the metal part 41 having the resin thin film 46 formed thereon, and the resin part 42 are joined, and the base member 40 is manufactured. The method for joining the metal part 41 and the resin part 42 is not restricted in particular, and it is possible to use an arbitrary method. The metal part 41 and the resin part 42 may be molded integrally by insert molding and the like, similarly as in the first embodiment.

In the manufacturing of the base member 40, the side wall 43a is formed by the resin part 42 around the resin thin film 46. Accordingly, the recess 43 defined by the side wall 43a and the base 43b is formed in a surface of the base member 40.

Next, the circuit pattern 14 formed by the plating film is formed on the resin part 42. As a method for forming the circuit pattern 14, it is possible to use a method similar to that in the first embodiment.

After forming the circuit pattern 14 on the resin part 42, the mounted component 15 is mounted in the recess 13 formed in the base member 40, and is electrically connected to the circuit pattern 14. Accordingly, it is possible to achieve the three-dimensional molded circuit component 400 of the present embodiment. A method for mounting is not restricted in particular, and similarly as in the first embodiment, it is possible to use a general-purpose method. In the present embodiment, it is preferable to use the laser soldering method or a local heating method of heating by a spot heater (spot mounting). By the laser soldering method and the local heating method by the spot heater, since only the resin thin film 46 is heated, it is possible to use a comparatively inexpensive resin having a low heat resistance for the resin part 42, and cost reduction of the overall three-dimensional molded circuit component 400 is facilitated.

In the three-dimensional molded circuit component of the present embodiment described heretofore, the mounted component 15 is mounted in the recess 43 formed in the base member 40. However, the present embodiment is not restricted to such mounting. For instance, the mounted component 15 is not necessarily required to be mounted in the recess, provided that the mounted component 15 is mounted on the resin thin film 46 similarly as in the first embodiment mentioned above. Even when the mounted component 15 is not mounted in the recess, by mounting the mounted component 15 on the resin thin film 46, it is possible to dissipate adequately the heat generated by the mounted component 15, by the metal part 41.

EXAMPLES

The present teaching will be described below specifically by examples and comparative examples. However, the present teaching is not restricted to the examples and the comparative examples described below.

Example 1

Figure 2:
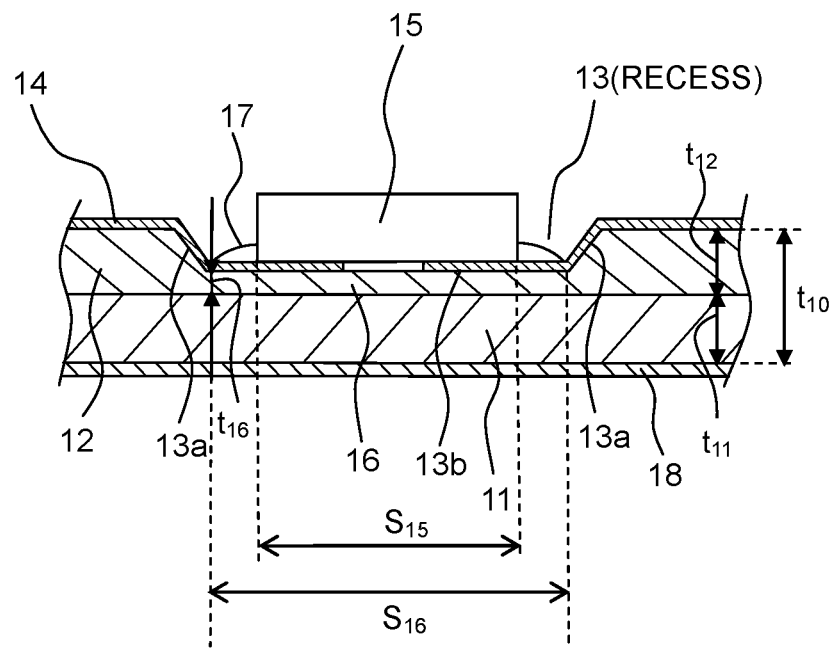
FIG. 2 is an enlarged view of a periphery of a mounted component in the cross-sectional schematic diagram of the three-dimensional molded circuit component shown in FIG. 1.

In the present example, the three-dimensional molded circuit component 100 shown in FIG. 1 was manufactured by using base member 10 in which the metal part 11 and the resin part 12 are integrally molded, and the resin thin film 16 is a portion of the resin part 12. Moreover, an LED (light emitting diode) was used as the mounted component 15.

(1) Manufacturing of Base Member

The base member 10 was manufactured by insert-molding by using an aluminum plate for the metal part 11 and an aromatic polyamide containing an inorganic filler (Bairo amido GP2X-5 manufactured by Toyobo, melting point 310° C.) for the resin part 12.

A mold having a cavity corresponding to the base member 10 which is a curved body in the form of the plate as shown in FIG. 1 was prepared. A thickness of the cavity corresponding to a thickness $t_{10}$ of the base member 10 was let to be 2 mm. In the cavity of the mold, a shape of a portion (projection in the cavity) corresponding to the recess 13 was let to be variable by using a bushing (nesting, bush) in order to be able to vary the thickness $t_{16}$ and the area of the resin thin film 16.

The aluminum plate having the plate thickness 1 mm was bent to match with a shape of the cavity of the mold. For improving the adhesion between the metal part 11 and the resin part 12 by the nano molding technology (NMT), a surface of the aluminum plate that was bent was etched. The etched aluminum plate was arranged (disposed, placed) at an appropriate position in the cavity of the mold, and the base member 10 was insert-molded by injection-filling the aromatic polyamide in a free space in the cavity. For insert-molding, a general-purpose injection molding apparatus was used, and the mold temperature was let to be 140° C. and the resin temperature was let to be 340° C. In the base member 10 that was achieved, a thickness $t_{11}$ of the metal part 11 (metal plate) was 1 mm, and a thickness $t_{12}$ of the resin part 12 was 1 mm. Moreover, by adjusting a size of the nesting (busing, bush) inside the mold cavity, the thickness $t_{16}$ of the resin thin layer was let to be 0.2 mm and the area of the resin thin film 16 was let to be 0.49 cm² (0.7 cm×0.7 cm). The depth $d_{13}$ of the recess 13 was let to be 1.8 mm.

(2) Formation of Circuit Pattern

In the present example, the circuit pattern 14 formed of the plating film on the resin part 12 was formed by a method described below.

(a) Synthesis of Catalytic Activity Inhibitor

An amide group was introduced into a commercially available hyper branched polymer (Hypertech HPS-200 manufactured by Nissan Kagaku Kogyou (Nissan Chemical Corporation)) represented by formula (1), and a hyper branched polymer represented by formula (2) was synthesized.

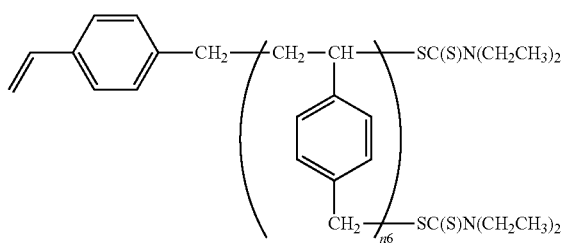

(1)

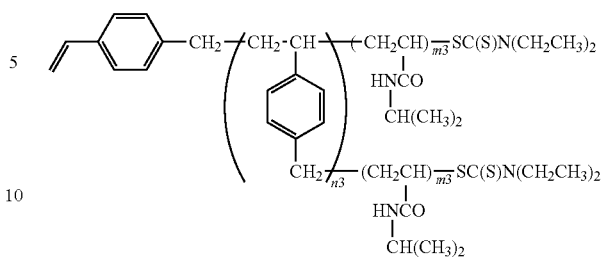

(2)

Firstly, the hyper branched polymer (1.3 g, dithiocarbamate group: 4.9 mmol), N-isopropylacrylamide (NIPAM) (1.10 g, 9.8 mmol), α, α'-azobisisobutyronitrile (AIBN) (81 mg, 0.49 mmol), and dehydrated tetrahydrofuran (THF) (10 mL) were added to a Schlenk tube (Schlenk flask), and the mixture was subjected to three freeze-pump-thaw cycles. Thereafter, the mixture was stirred and allowed to react overnight (for 18 hours) at 70° C. using an oil bath, and after the completion of reaction, was cooled by iced water (ice-cold water), and then diluted appropriately by THF. Next, the diluted mixture was re-precipitated in hexane, and a solid product material achieved was vacuum-dried overnight at 60° C. An NMR (nuclear magnetic resonance) measurement and an IR (infrared absorption spectrum) measurement of the product material was carried out. As a result, it could be confirmed that by introducing the amide group into the commercially available hyper branched polymer represented by formula (1), a polymer represented by formula (2) was prepared. Next, a molecular weight of the product material was measured by GPC (gel permeation chromatography). Regarding the molecular weight, a number-average molecular weight (Mn) was 9,946 and a weight-average molecular weight (Mw) was 24,792, and the number-average molecular weight (Mn) and the weight-average molecular weight (Mw) unique to the hyper-branched structure were substantially different values. The yield of the hyper-branched polymer represented by formula (2) was 92%.

(b) Formation of Catalytic Activity Inhibiting Layer

The synthesized polymer represented by formula (2) was dissolved in methyl ethyl ketone, and a polymer solution of polymer concentration 0.5 wt % was prepared. The base member 10 that was molded was dipped into the polymer solution for five seconds at a room temperature, and thereafter, dried in a drier for five minutes at 85° C. Accordingly, a catalytic activity inhibiting layer was formed on the surface of the base member 10. A film thickness of the catalytic activity inhibiting layer was approximately 70 nm.

(c) Laser Drawing

A portion corresponding to the circuit pattern 14, on the surface of the resin part 12 on which the catalytic activity inhibiting layer was formed, was laser-drawn by using a 3-D laser marker (fiber laser manufactured by Keyence, the output 50 W) at (with) a processing (machining) speed of 2000 mm/s. A line width of a drawing pattern was let to be 0.3 mm, and the minimum distance between adjacent drawing line was let to be 0.5 mm. By the laser drawing, it was possible to remove the catalytic activity inhibiting layer on a laser-drawn (laser drawing) portion. Moreover, the laser-drawn portion was roughened, and the filler included in the resin part 12 was exposed.

(d) Application of Electroless Plating Catalyst and Formation of Plating Film

The base member 10 subjected to laser-drawing was immersed (soaked) in palladium chloride solution (Activator, manufactured by Okuno Chemical Industries Co. Ltd.) for five minutes at 30° C., and an electroless plating catalyst was applied. The base member 10 was washed with water, and next, the base member 10 was immersed in an electroless nickel phosphorous plating solution (Top Nicoron LPH-L manufactured by Okuno Chemical Industries Co. Ltd, pH 6.5) for 10 minutes at 60° C. Approximately 1 µm nickel phosphorous film (electroless nickel phosphorous film) was grown selectively on the laser-drawn portion on the resin part 12. At the same time, approximately 1 µm nickel phosphorous film 18 was formed also on the surface of the metal part 11 (aluminum plate).

Furthermore, 10 µm electrolytic copper plating film, 1 µm electrolytic nick plating film, and 0.1 µm electrolytic gold plating film were stacked in this order on the nickel phosphorous film of the laser drawing portion by a general-purpose method, and the circuit pattern 14 was formed. In the present example, the circuit pattern 14 was formed even on the resin thin film 16 without breaking of wire.

(3) Mounting of Mounted Component

The solder 17 and the mounted component (LED) 15 were arranged (disposed, placed) in the recess 13 formed in the base member 10. Furthermore, a solder and a resistance not shown in the diagram were arranged (disposed) on a portion of the base member 10, other than the recess 13. The mounted component 15 and the resistance (not shown in the diagram) were arranged (disposed) at positions electrically connectible to the circuit pattern 14. Next, the base member 10 was passed through the reflow furnace. The base member 10 was heated in the reflow furnace, and the maximum temperature attained of the base member 10 become approximately 240° C., and the time for which the base member 10 was heated at the maximum temperature attained was 30 seconds. The mounted component 15 was mounted on the base member 10 by the solder 17, and the three-dimensional molded circuit component 100 of the present example was achieved.

Example 2

In the present example, the three-dimensional molded circuit component 100 shown in FIG. 1 was manufactured by a method similar to that in the example 1, except for the thickness of the resin thin film 16, which was let to be 0.05 mm.

Example 3

In the present example, the three-dimensional molded circuit component 100 shown in FIG. 1 was manufactured by a method similar to that in the example 1, except for the thickness of the resin thin film 16, which was let to be 0.1 mm.

Example 4

In the present example, the three-dimensional molded circuit component 100 shown in FIG. 1 was manufactured by a method similar to that in the example 1, except for the thickness of the resin thin film 16, which was let to be 0.5 mm.

Example 5

In the present example, the three-dimensional molded circuit component 100 shown in FIG. 1 was manufactured by a method similar to that in the example 1, except for the area of the resin thin film 16, which was let to be 4 $cm^2$ (2 cm×2 cm).

Example 6

In the present example, the three-dimensional molded circuit component 100 shown in FIG. 1 was manufactured by a method similar to that in the example 1, except for the area of the resin thin film 16, which was let to be 16 $cm^2$ (4 cm×4 cm).

Example 7

In the present example, the three-dimensional molded circuit component 100 shown in FIG. 1 was manufactured by a method similar to that in the example 1, except for the area of the resin thin film 16, which was let to be 25 $cm^2$ (5 cm×5 cm).

Comparative Example 1

In the present comparative example, the three-dimensional molded circuit component 100 shown in FIG. 1 was manufactured by a method similar to that in the example 1, except for the thickness of the resin thin film 16, which was let to be 0.008 mm.

Comparative Example 2

In the present comparative example, the three-dimensional molded circuit component 100 shown in FIG. 1 was manufactured by a method similar to that in the example 1, except for the thickness of the resin thin film 16, which was let to be 0.7 mm.

[Evaluation of Three-Dimensional Molded Circuit Component]

The following evaluation was carried out for the three-dimensional molded circuit components manufactured in the examples 1 to 7, and the comparative examples 1 and 2. The results are shown in N 1.

(1) Moldability of Resin Thin Film

A moldability of the resin thin film in the integrated molding of the base member was evaluated according to the following evaluation criteria.

<Evaluation Criteria for Moldability of Resin Thin Film>
+: An unfilled portion of the molten resin (A portion not filled with the molten resin) was not developed (generated) in the resin thin film.
−: An unfilled portion of the molten resin (a portion not filled with the molten resin) was developed (generated) in the resin thin film.

(2) Heat Dissipation Property of Three-Dimensional Molded Circuit Component

A predetermined electric voltage was applied to the three-dimensional molded circuit component manufactured, and an LED was lit. An LED surface temperature was measured by thermography after one hour after the LED was lit. The heat dissipation property of the three-dimensional molded circuit component was evaluated according to the following evaluation criteria.

<Evaluation Criteria for Heat Dissipation Property of Three-Dimensional Molded Circuit Component>
+: The LED surface temperature after lighting the LED for one hour was not more than 100° C.
−: The LED surface temperature after lighting the LED for one hour was more than 100° C.

TABLE 1

|  | Resin thin film | | | Heat dissipation property |
| --- | --- | --- | --- | --- |
|  | Thickness (mm) | Area (cm²) | Moldability of resin thin film | (LED surface temperature) |
| Example 1 | 0.2 | 0.49 | + | +(80° C.) |
| Example 2 | 0.05 | 0.49 | + | +(70° C.) |
| Example 3 | 0.1 | 0.49 | + | +(75° C.) |
| Example 4 | 0.5 | 0.49 | + | +(95° C.) |
| Example 5 | 0.2 | 4.0 | + | +(78° C.) |
| Example 6 | 0.2 | 16 | + | +(75° C.) |
| Example 7 | 0.2 | 25 | + | +(70° C.) |
| Comparative example 1 | 0.008 | 0.49 | − | N/A |
| Comparative example 2 | 0.7 | 0.49 | + | −(105° C.) |

As shown in table 1, in the examples 1 to 7 in which the thickness of the resin thin film is in the range of 0.01 mm to 0.5 mm, both the moldability of the resin thin film and the heat dissipation property of the three-dimensional molded circuit component were favorable. When the examples 1 to 4 in which only the thickness of the resin thin film differs, were compared, it was revealed that, the thinner the thickness of the resin thin film, the lower is the LED surface temperature after lighting the LED for one hour, and the higher is the heat dissipation property of the three-dimensional molded circuit component. Moreover, when the example 1 and the examples 5 to 7 in which only the area of the resin thin differs, were compared, it was revealed that the larger the area of the resin thin film, the lower is the LED surface temperature after lighting the LED for one hour, and the higher is the heat dissipation property of the three-dimensional molded circuit component. The larger the area of the resin thin film, the more difficult it is to mold the resin thin film. However, even in the example 7 in which the area of the resin thin film is 25 cm², the unfilled portion of the molten resin (the portion not filled with the molten resin) was not developed (generated), and the moldability was favorable.

Whereas, in the comparative example 1 in which the thickness of the resin thin film is 0.008 mm which is thin, the unfilled portion of the molten resin (the portion not filled with the molten resin) was developed (generated), and the moldability was poor. Therefore, in the comparative example 1, evaluation of the heat dissipation property of the three-dimensional molded circuit component was not carried out. In the comparative example 2 in which the thickness of the resin thin film is 0.7 mm which is thick, the heat dissipation property of the three-dimensional molded circuit component was poor.

Example 8

In the present example, a three-dimensional molded circuit component was manufactured by a method similar to that in the example 1, except for a heat dissipating fin made of aluminum which was used instead of the aluminum plate, as the metal part. In other words, the three-dimensional molded circuit component manufactured in the present embodiment is the three-dimensional molded circuit component 200 shown in FIG. 5.

Evaluation of (1) the moldability of the resin thin film and (2) the heat dissipation property of the three-dimensional molded circuit component was carried out similarly as in the example 1. The moldability of the resin thin film was favorable. The heat dissipation property of the three-dimensional molded circuit component was favorable, and the LED surface temperature after lighting the LED for one hour was 70° C., which is 10° C. lower than that in the example 1. From this result, it could be confirmed that the heat dissipation property improves by using the heat dissipating fin for the metal part.

Example 9

In the present example, the thickness of the resin thin film was let to be 0.15 mm, and the resin part of the base member was foam-molded, and the mounted component (LED) was mounted on the base member by the laser soldering method (spot mounting). Except for the abovementioned points, a three-dimensional molded circuit component was manufactured by a method similar to that in the example 1. In other words, the three-dimensional molded circuit component manufactured in the present example is the three-dimensional molded circuit component 300 shown in FIG. 6. In the present example, the base member was integrally molded by insert-molding by using a mold similar to the mold used in the example 1. A molding apparatus disclosed in WO 2013/027615 Publication was used as the molding apparatus, and the resin part was foam-molded by using pressurized nitrogen as a physical foaming agent. A filling pressure of nitrogen was let to be 10 MPa, and a backpressure-valve pressure of a vent pressure reducing portion was let to be 6 MPa.

A specific gravity of the resin part 32 of the three-dimensional molded circuit component 300 that was achieved, became approximately 8% lower as compared to that of a solid (non-foamed body). A cross-section of the resin part 32 and a cross-section of the resin thin film 36 were observed by a microscope. A cell diameter of the cells 39 of the resin part 32 was in the range of 30 μm to 80 μm which is minute. Whereas, the foamed cells were not discovered (found) on the cross-section of the resin thin film 36. In other words, the resin thin film 36 did not essentially (practically) include the foamed cells. Moreover, in the laser soldering (spot mounting) of the mounted component (LED), no bloating (bulging, swelling) was observed on the resin thin film 36 to which the laser light was irradiated.

Furthermore, an experiment of irradiating laser light same as that used in the laser soldering method (spot mounting) to the resin part 32 including the foamed cells 39, of the three-dimensional molded circuit component 300 achieved, was carried out. When the laser light was irradiated, bloating (bulging, swelling) occurred in the resin part 32 including the foamed cells 39. From this result, it was revealed that by carrying out the foam-molding, the heat resistance of the resin part 32 was lowered, however, by not forming the foamed cells in the resin thin film 36, it is possible to maintain the heat resistance of the resin thin film 36 on which the LED is mounted. In the three-dimensional molded circuit component 300 of the present example, the overall components were made light-weight successfully while maintaining the heat resistance of the LED mounting portion (portion on which the LED is mounted).

Example 10

In the present example, the three-dimensional molded circuit component 400 shown in FIG. 7 was manufactured by using the base member 40 in which the metal part 41 and the resin part 42 are integrally molded, and the resin thin film

46 is formed of a heat-curable (thermosetting) resin. Moreover, an LED (light emitting diode) was used as the mounted component 15.

(1) Manufacturing of Base Member

An aluminum block was used for the metal part 41, and an aromatic polyamide containing inorganic filler similar to the resin used in the example 1 (Bairo amido GP2X-5 manufactured by Toyobo, melting point 310° C.) was used for the resin part 42. Moreover, for the resin thin film 46, a polyimide which is a thermosetting (heat-curable) resin containing boron nitride powder having an average particle diameter (particle size) of 4 μm as an insulating heat dissipating material was used.

Firstly, polyamide acid which is a polyimide precursor and boron nitride powder were dispersed and dissolved in N-methyl-2-pirolidone (NMP), and a resin slurry solution having polyimide concentration (solid-content concentration) 12 wt % and boron nitride concentration 50 wt % was prepared. The resin slurry solution prepared was applied to the surface 41$a$ of the metal part 41, and was hardened (cured) by heating at 350° C. for 30 minutes, and the resin thin film 46 was formed. An area of the resin thin film 46 was let to be 1 cm² (1 cm×1 cm), and the thickness $t_{46}$ of the resin thin film 46 was let to be 20 μm. Moreover, the content of boron nitride in the resin thin film 46 was let to be 70 percent by volume (70 volume percent).

A mold having a cavity corresponding to the base member 40 shown in FIG. 7 was prepared. A portion (projection in the cavity) corresponding to the recess 43 was provided in the cavity of the mold. For improving the adhesion between the metal part 41 and the resin part 42 by the nano molding technology (NMT), a surface of the metal part 41 (aluminum block) was etched. The etched aluminum metal part 41 was arranged (disposed, placed) at an appropriate position in the cavity of the mold, and the base member 40 was insert-molded by injection-filling the aromatic polyamide in a free space (region) in the cavity. For insert-molding, an injection molding apparatus similar to that in the example 1 was used and insert-molding was carried out with similar molding conditions (mold temperature 140° C., resin temperature 340° C.). The recess 43 defined by the side wall 43$a$ formed by the resin part 42 and the base 43$b$ formed by the resin thin film 46 was formed in the base member 40 that was achieved. The depth of the recess 43 was let to be 1.8 mm.

(2) Formation of Circuit Pattern and Mounting of Mounted Component

By a method similar to that in the example 1, the circuit pattern 14 formed by the plating film on the resin part 42 was formed. In the present example, the circuit pattern 14 was formed even on the resin thin film 46 without breaking of wire. Next, by a method similar to that in the example 1, the mounted component (LED) 15 was mounted in the recess 43 formed in the base member 40. Accordingly, the three-dimensional molded circuit component 400 shown in FIG. 7 was achieved.

The heat dissipation property of the three-dimensional molded circuit component was evaluated by a method similar to that in the example 1. The heat dissipation property of the three-dimensional molded circuit component was favorable, and the LED surface temperature after lighting the LED for one hour was 65° C., which was 15° C. lower than that in the example 1. From this result, it could be confirmed that the heat dissipation property improves by making the resin thin film thin, and furthermore, by containing a heat dissipating material. Moreover, it could be confirmed that it is possible to manufacture a thin resin thin film easily by using a thermosetting resin.

Example 11

In the present example, a three-dimensional molded circuit component was manufactured by a method similar to that in the example 1, except for using a strongly-basic electroless copper plating solution (manufactured by Okuno Chemical Industries Co. Ltd., pH 12) instead of the neutral electroless nickel phosphorous plating solution in the formation of the circuit pattern.

A surface of the metal part (aluminum plate) of the three-dimensional molded circuit component achieved in the present example was corroded, and copper was precipitated (deposited) on a portion thereof. Adhesion of the copper precipitated (deposited) was low, and was peeled off (exfoliated) easily. The heat dissipation property of the three-dimensional molded circuit component was evaluated by a method similar to that in the example 1 after removing by peeling off (exfoliating) the copper and the corroded portion of the surface of the metal part. The heat dissipation property of the three-dimensional molded circuit component of the present example was favorable, and the LED surface temperature after lighting the LED for one hour was lit was 80° C. which is same as in the example 1. From this result, it was revealed that the corrosion of the metal part occurs when aluminum is used for the metal part and a strongly-basic plating solution is used for the plating solution. However, it could be confirmed that when the copper and the corroded portion of the surface of the metal part are removed, there is no problem in practical use of the three-dimensional molded circuit component.

The three-dimensional molded circuit component of the present teaching has a high (superior) heat dissipating property, and moreover, is easy to mold and has a high productivity. Therefore, it is possible to suppress the temperature of the three-dimensional molded circuit component from becoming high due to generation of heat by a mounted component such as an LED and the like. The three-dimensional molded circuit component is applicable in smart telephones and automobile components.

What is claimed is:

1. A three-dimensional molded circuit component, comprising:
    a base member which includes a metal part and a resin part;
    a circuit pattern which is formed on the resin part;
    a resin thin film which is formed on the metal part, and which includes one of a thermosetting resin and a photo-curable resin; and
    a mounted component which is mounted on the resin thin film, and is electrically connected to the circuit pattern, wherein
    the resin thin film has a first surface and a second surface opposing each other, the first surface of the resin thin film is formed on the metal part, and the second surface of the resin thin film is formed with a part of the circuit pattern, on which the mounted component is disposed,
    the mounted component is electrically connected, by a solder, to the part of the circuit pattern formed on the second surface of the resin thin film,
    on the base member, a recess is defined by a side wall formed by the resin part and a base formed by the resin thin film, the mounted component is mounted in the recess,
    a thickness of the resin thin film is in the range of 0.01 mm to 0.5 mm, and
    the resin thin film is not a portion of the resin part and is a separate member from the resin part.

2. The three-dimensional molded circuit component according to claim 1, wherein the resin thin film contains a heat dissipating material having an insulation property.

3. The three-dimensional molded circuit component according to claim 1, wherein the mounted component is a light emitting diode.

4. The three-dimensional molded circuit component according to claim 1, wherein a nickel phosphorous film is formed on a surface of the metal part.

5. The three-dimensional molded circuit component according to claim 1, wherein the resin part includes a thermoplastic resin.

6. The three-dimensional molded circuit component according to claim 1, wherein the photo-curable resin is selected from the group consisting of a polyimide resin and an epoxy resin.

7. The three-dimensional molded circuit component according to claim 1, wherein the resin thin film includes the thermosetting resin.

8. The three-dimensional molded circuit component according to claim 1, wherein the thickness of the resin thin film is thinner than that of the resin part.

9. The three-dimensional molded circuit component according to claim 1, wherein the thickness of the metal part is 0.5 mm or more, and the thickness of the resin part is 0.5 mm or more.

* * * * *